United States Patent
Cho et al.

(10) Patent No.: US 11,984,817 B2
(45) Date of Patent: May 14, 2024

(54) LOW POWER INVERTER-BASED CTLE

(71) Applicant: XILINX, INC., San Jose, CA (US)

(72) Inventors: Junho Cho, San Jose, CA (US); Kevin Zheng, San Jose, CA (US); Parag Upadhyaya, Los Gatos, CA (US)

(73) Assignee: XILINX, INC., San Jose, CA (US)

( * ) Notice: Subject to any disclaimer, the term of this patent is extended or adjusted under 35 U.S.C. 154(b) by 627 days.

(21) Appl. No.: 16/814,626

(22) Filed: Mar. 10, 2020

(65) Prior Publication Data
US 2021/0288590 A1 Sep. 16, 2021

(51) Int. Cl.
H02M 7/483 (2007.01)
(52) U.S. Cl.
CPC .......... *H02M 7/483* (2013.01); *H02M 7/4835* (2021.05)
(58) Field of Classification Search
CPC ......... H04L 27/02; H04L 27/10; H04L 27/18; H04L 27/26; H04L 27/01; H04L 27/32; H04L 25/0272; H04L 25/03019; H04L 25/03057; H04L 25/03878
See application file for complete search history.

(56) References Cited

U.S. PATENT DOCUMENTS

| | | | | |
|---|---|---|---|---|
| 5,598,111 A * | 1/1997 | Enomoto | ............... | H03K 5/133 327/264 |
| 7,639,094 B1 * | 12/2009 | Stevenson | ................ | H03B 5/36 331/162 |
| 9,654,310 B1 * | 5/2017 | Chang | ................... | H03H 15/02 |
| 10,014,036 B1 * | 7/2018 | Zhou | ........................ | G11C 7/10 |
| 2014/0015582 A1 * | 1/2014 | Huang | ............. | H03K 3/356139 327/211 |
| 2016/0173066 A1 * | 6/2016 | Yang | ................ | H03K 19/01714 327/109 |
| 2018/0234096 A1 * | 8/2018 | Li | ........................ | H03K 17/941 |

OTHER PUBLICATIONS

Aggarwal, Mayank, "Low Power Analog Front End Design for 112 gbps PAM-4 Serdes Receiver", Nov. 1, 2020, 156 pages.
Zheng, Kevin, et al., "A 56 Gb/S 6 mW 300 um2 inverter-based CTLE for short-reach PAM2 applications in 16 nm CMOS", 2018 IEEE Custom Integrated Circuits Conference (CICC) (4 pages).
Zheng, Kevin, et al., "An Inverter-based Analog Front End for a 56 Gb/s PAM4 Wireline Transceiver in 16mm CMOS", 2018 IEEE Symposium on VLSI Circuits (2 pages).

* cited by examiner

*Primary Examiner* — Bryan R Perez
(74) *Attorney, Agent, or Firm* — Patterson + Sheridan, LLP

(57) ABSTRACT

An example continuous time linear equalizer (CTLE) includes a first inverter; a second inverter having an input to receive an input signal; a capacitor coupled between an input of the first inverter and the input of the second inverter; a resistor coupled between a common-mode voltage and the input of the first inverter; a third inverter having an output to provide an output signal; and a node comprising an output of the first inverter, an output of the second inverter, an input of the third inverter, and the output of the third inverter.

20 Claims, 9 Drawing Sheets

LOW POWER INVERTER-BASED CTLE

TECHNICAL FIELD

Examples of the present disclosure generally relate to electronic circuits and, in particular, to low power inverter-based continuous time linear equalizer (CTLE).

BACKGROUND

A continuous time linear equalizer (CTLE) is a core analog building block of a wireline receiver front-end for signal equalization. Various CTLE architectures have been researched to optimize power, area, and performance. Conventional CTLE circuits employ current mode logic (CML) circuits. Recently, CTLE design is focusing on inverter-based circuits due to a smaller die area compared to CML-based designs. The power and performance of inverter-based designs, however, depend on their topology, the number and size of the inverters, and their linearity. It is desirable to provide a low-power inverter-based design for a CTLE.

SUMMARY

Techniques for providing a low power inverter-based CTLE are described. In an example, a continuous time linear equalizer (CTLE) includes: a first inverter; a second inverter having an input to receive an input signal; a capacitor coupled between an input of the first inverter and the input of the second inverter; a resistor coupled between a common-mode voltage and the input of the first inverter; a third inverter having an output to provide an output signal; and a node comprising an output of the first inverter, an output of the second inverter, an input of the third inverter, and the output of the third inverter.

In another example, a receiver includes a front-end circuit having a continuous time linear equalizer (CTLE) and a digital backend circuit coupled to the front-end circuit. The CTLE includes: a first inverter; a second inverter having an input to receive an input signal; a capacitor coupled between an input of the first inverter and the input of the second inverter; a resistor coupled between a common-mode voltage and the input of the first inverter; a third inverter having an output to provide an output signal; and a node comprising an output of the first inverter, an output of the second inverter, an input of the third inverter, and the output of the third inverter.

In another example, a continuous time linear equalizer (CTLE) includes: a first inverter; a second inverter having an input to receive an input signal; a capacitor coupled between an input of the first inverter and the input of the second inverter; a first resistor coupled between a common-mode voltage and the input of the first inverter; a third inverter; a node comprising an output of the first inverter, an output of the second inverter, an output of the third inverter, the node providing an output signal; and a second resistor coupled between an input of the third inverter and the node.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
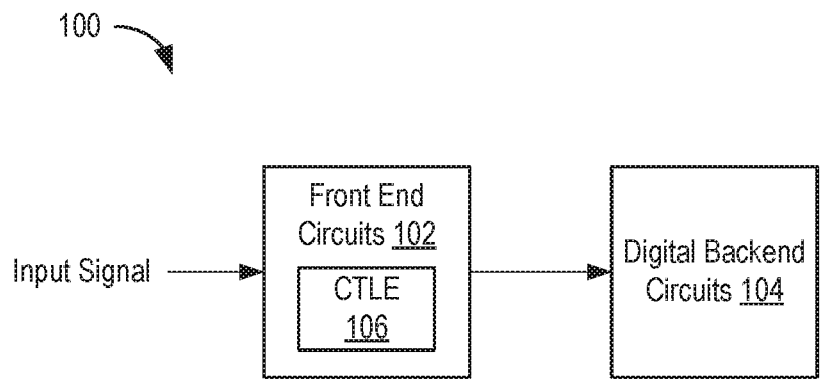
FIG. 1 is a block diagram depicting a receiver according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

FIG. 1 is a block diagram depicting a receiver 100 according to an example. The receiver 100 includes front-end circuits 102 and digital backend circuits 104. The front-end circuits 102 include a continuous time linear equalizer (CTLE) 106 among other components (e.g., automatic gain control circuits, filters, additional CTLEs that can be either the same as CTLE 106 or different, etc.). The digital backend circuits 104 include various circuits for processing an analog signal output by the front-end circuits 102 (e.g., samplers, analog-to-digital converters (ADCs), decision feedback equalizer (DFE) circuits, clock and data recover circuits, etc.). The CTLE 106 receives an input signal and operates as a high-pass filter to compensate for the low-pass characteristics of the transmission medium providing the input signal. Both the peaking magnitude and the location of frequency response of the CTLE 106 can be adjusted by control circuits in the front-end circuits 102 and/or the digital backend circuits 104. Example implementations of the CTLE 106 are described below.

Figure 2:
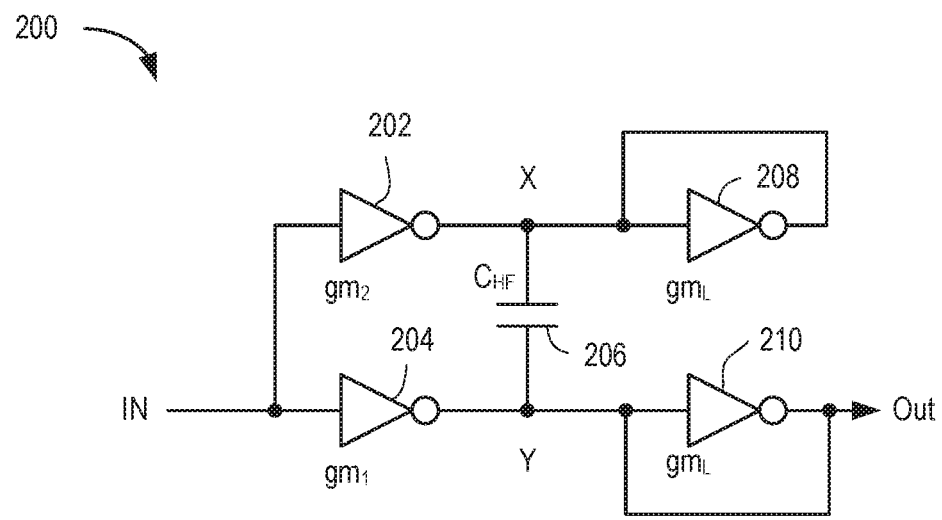
FIG. 2 is a schematic diagram depicting a CTLE according to the prior art.

FIG. 2 is a schematic diagram depicting a CTLE 200 according to the prior art. Such a circuit is described in Zheng, Kevin et al., "A 56 Gb/s 6 mW 300 um² inverter-based CTLE for short-reach PAM2 applications in 16 nm CMOS," 2018 IEEE Custom Integrated Circuits Conference (CICC). The CTLE 200 includes inverters 202, 204, 208, and 210, and a capacitor 206. Inputs of the inverters 202 and 204 are coupled to receive an input signal (IN). An output of the inverter 202 is coupled to a node X. An output of the inverter 204 is coupled to a node Y. The capacitor 206 is coupled between the nodes X and Y. Both the input and the output of the inverter 208 is coupled to the node X. Both the input and the output of the inverter 210 is coupled to the node Y. The output of the inverter 210 provides an output signal (OUT).

Assume the inverter 204 has a transconductance $gm_1$, the inverter 202 has a transconductance $gm_2$, the inverters 208 and 210 have a transconductance $gm_L$, and the capacitor 206 has a capacitance $C_{HF}$. The CTLE 200 is an inverter-based CTLE using an additive topology. A peaking is achieved by adding $gm_2$ to the high-frequency signal path through the capacitor 206 (giving rise to the "additive" topology). The low-frequency gain (G1), high-frequency gain (G2), and peaking are defined by the equations:

$G1=gm_1/gm_L$ $G2=(gm_1+gm_2)/(2*gm_L)$ $Peaking(dB)=20*log[(gm_1+gm_2)/2*gm_1]$ The boundary of low and high frequency is determined by $C_{HF}$ and $gm_L$.

Figure 3:
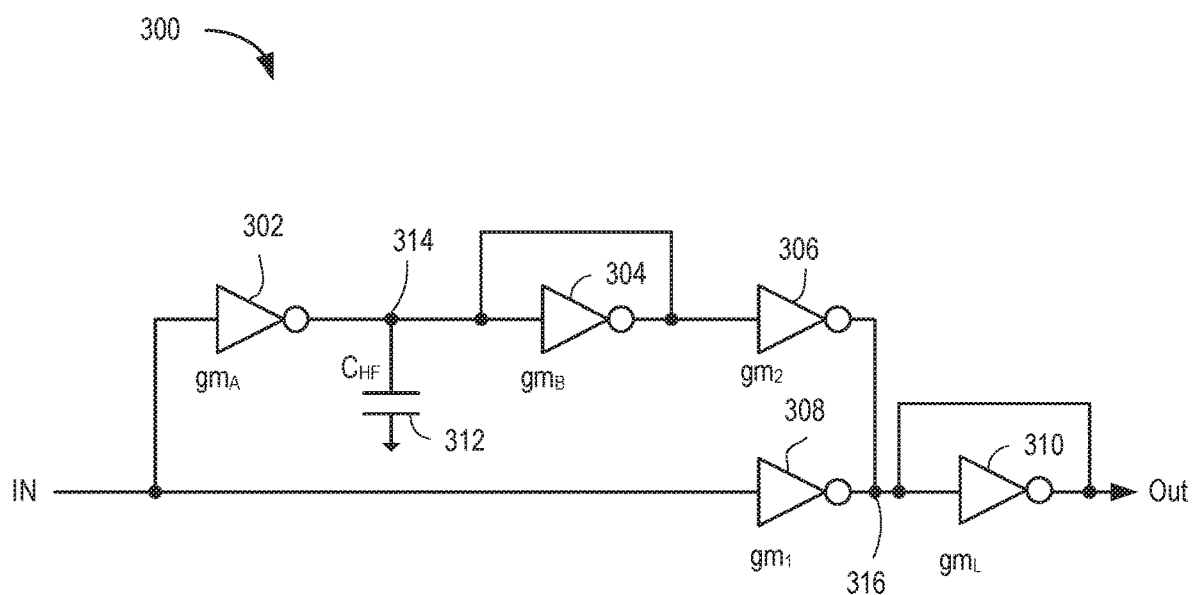
FIG. 3 is a schematic diagram depicting a CTLE according to the prior art.

FIG. 3 is a schematic diagram depicting a CTLE 300 according to the prior art. The CTLE of FIG. 3 uses a subtractive topology, such as that described in Zheng, Kevin et al., "An Inverter-based Analog Front End for a 56 Gb/s PAM4 Wireline Transceiver in 16 nm CMOS," 2018 IEEE Symposium on VLSI Circuits. The CTLE 300 includes inverters 302, 304, 306, 308, and 310, and capacitor 312. Inputs of the inverters 302 and 308 are coupled to receive an input signal (IN). An output of the inverter 302 is coupled to: an input of the inverter 304, an output of the inverter 304, and an input of the inverter 306 (referred to as node 314). An output of the inverter 306 is coupled to: an output of the inverter 308, an input of the inverter 310, and an output of the inverter 310 (referred to as node 316). The node 316 provides the output signal (OUT).

Assume the inverter 302 has a transconductance $gm_A$, the inverter 304 has a transconductance $gm_B$, the inverter 306 has a transconductance $gm_2$, the inverter 308 has a transconductance $gm_1$, and the inverter 310 has a transconductance $gm_L$. For the CTLE 300, the G1, G2, and peaking are defined by the equations below:

$G1=(gm_1/gm_L)-(gm_A/gm_B)*(gm_2/gm_L)$ $G2=gm_1/gm_L$ $Peaking(dB)=20*log[(gm_B*gm_1)/(gm_B*gm_1-gm_A*gm_2)]$ The boundary of low and high frequency is determined by $C_{HF}$ and $gm_B$.

Even though inverter-based CTLE designs are attractive in terms of area consumption, its power consumption is a main design issue. The more aggressive equalization is required, the more power is consumed by the CTLE. Another design issue of inverter-based CTLE is linearity, which affects signal-to-noise-and-distortion ratio (SNDR). To illustrate power consumption estimation, assume G1=0 dB, G2=6 dB, which gives 6 dB peaking.

Consider the additive topology shown in FIG. 2. In such case:

$G1=gm_1/gm_L=1(0$ dB$)$ $G2=(gm_1+gm_2)/(2*gm_L)=2(6$ dB$)$ $gm_1=gm_L$ $gm_2=3*gm_L$

Total $gm=gm_1+gm_2+2*gm_L=gm_L+3*gm_L+2*gm_L=6*gm_L$

Thus, the inverter 202 has a transconductance of $3*gm_L$, and the inverter 204 has a transconductance of $gm_L$ in this example. Total device drain parasitic capacitance is approximately 6*Cdd; total device gate parasitic capacitance is approximately 2*Cgg, where Cdd and Cgg are the drain and gate capacitance, respectively, of an inverter having a transconductance of $gm_L$. The additive topology of FIG. 2 has a linearity problem because of common mode mismatch between node X and node Y. The DC bias condition at node X and node Y is not identical due to the capacitance $C_{HF}$ and two different $gm_L$ inverters. More specifically, when all devices are perfectly matched, the biasing conditions of the inverters would actually be the same. However, nonlinearity is present when input swing comes into the picture. In this topology, the top path requires a gain of $3\times(gm_2/gm_L=3)$ to achieve 6 dB peaking. In this case, the top path can become saturated when there is a large input swing. This will cause the inverters to have very different large signal bias compared to the bottom path.

In the subtractive topology of FIG. 3, again assume G1=0 dB, G2=6 dB, which gives 6 dB peaking. In such case:

$G1=(gm_1/gm_L)-(gm_A/gm_B)*(gm_2/gm_L)=1(0$ dB$)$     (1)

$G2=gm_1/gm_L=2(6$ dB$)\rightarrow gm_1=2*gm_L$     (2)

From (1), $gm_1-(gm_A/gm_B)*gm_2=gm_L$     (3)

From (2) and (3), $gm_2=(gm_B/gm_A)*gm_L$

Total $gm=gm_1+gm_2+gm_L=2*gm_L+(gm_B/gm_A)*gm_L+gm_L=3*gm_L+(gm_B/gm_A)*gm_L$

If $gm_A=gm_B$, then total gm is $4*gm_L$

To get a fair comparison with the additive topology of FIG. 2, in terms of gain bandwidth product, $gm_L$ of the subtractive topology of FIG. 3 should be doubled (e.g., $2*gm_L$). Thus, the inverter 306 has a transconductance $2*gm_L$, the inverter 308 has a transconductance $4*gm_L$, and the inverter 310 has a transconductance $2*gm_L$. Assuming $gm_A=gm_B$, total gm is now $8*gm_L$. Total device drain parasitic capacitance at OUT is approximately 8*Cdd; total device gate parasitic capacitance at OUT is approximately 2*Cgg, where Cdd and Cgg are the drain and gate parasitic capacitances, respectively, of an inverter with $gm_L$ transconductance.

Comparing the additive topology of FIG. 2 with the subtractive topology of FIG. 3, the subtractive topology improves linearity because the output of the inverter 308 and the output of the inverter 306 are tied together. In particular, tying together the outputs of the inverters 306 and 308 makes their large signal bias conditions very similar, thus eliminating the issue in the additive topology of FIG. 2. However, the subtractive topology of FIG. 3 shows higher power consumption and more device parasitic capacitance to have the same gain bandwidth product as the additive topology of FIG. 2.

Figure 4:
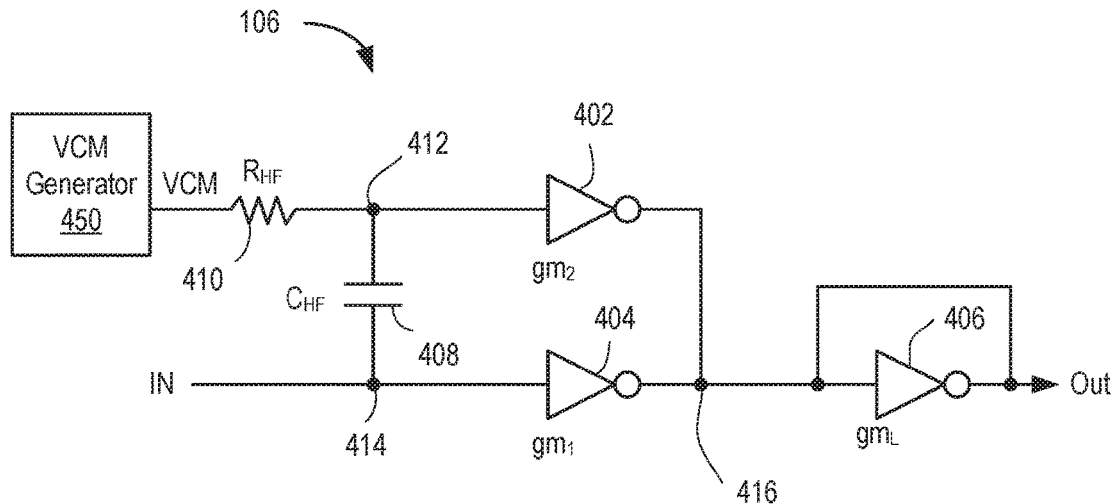
FIG. 4 is a schematic diagram depicting the CTLE of FIG. 1 according to an example.

FIG. 4 is a schematic diagram depicting the CTLE 106 according to an example. The CTLE 106 includes inverters 402, 404, and 406, as well as a capacitor 408 and a resistor 410. The CTLE 106 can be coupled to a VCM generator 450. An example VCM generator 450 is described below with respect to FIG. 10. Those skilled in the art will appreciate that other types of common-mode voltage generators can be used. A node 412 is coupled to an input of the inverter 402. A node 414 is coupled to an input of the inverter 404. The capacitor 408 is coupled between the nodes 412 and 414. The resistor 410 is coupled between a voltage VCM and the node 412. The node 414 receives the input signal (IN). An output of the inverter 402 is coupled to: an output of the inverter 404, an input of the inverter 406, and an output of the inverter 406 (referred to as node 416). The node 416 provides the output signal (OUT). The resistor 410 has a resistance $R_{HF}$; the capacitor 408 has a capacitance $C_{HF}$; the inverter 404 has a transconductance $gm_1$; the inverter 402 has a transconductance $gm_2$; and the inverter 406 has a transconductance $gm_L$.

The CTLE 106 shown in FIG. 4 employs an additive topology. Contrary to the CTLE 200 of FIG. 2, the capacitor 408 is disposed at the input of the inverters 402 and 404. Further, the CTLE 106 of FIG. 4 omits one of the $gm_L$ inverters (e.g., the inverter 208). The voltage VCM is an input common mode voltage that is internally generated by the front-end circuits 102. Examples of generating VCM are described below.

For the CTLE 106, G1 and G2 are defined by the equations below:

$G1 = gm_1/gm_L$ $G2 = (gm_1 + gm_2)/gm_L$ $Peaking(dB) = 20*\log[(gm_1 + gm_2)/gm_1]$ In low frequency, the input signal is blocked by the capacitor 408. In high frequency, the input signal passes through the capacitor 408. Thus, the CTLE 106 is an additive topology. The transfer function of the CTLE 106 is:

$(gm_1/gm_L)*(1+(gm_2/gm_1)*(sR_{HF}C_{HF}/(1+sR_{HF}C_{HF})))$, where s is a complex number frequency parameter.

Figure 5:
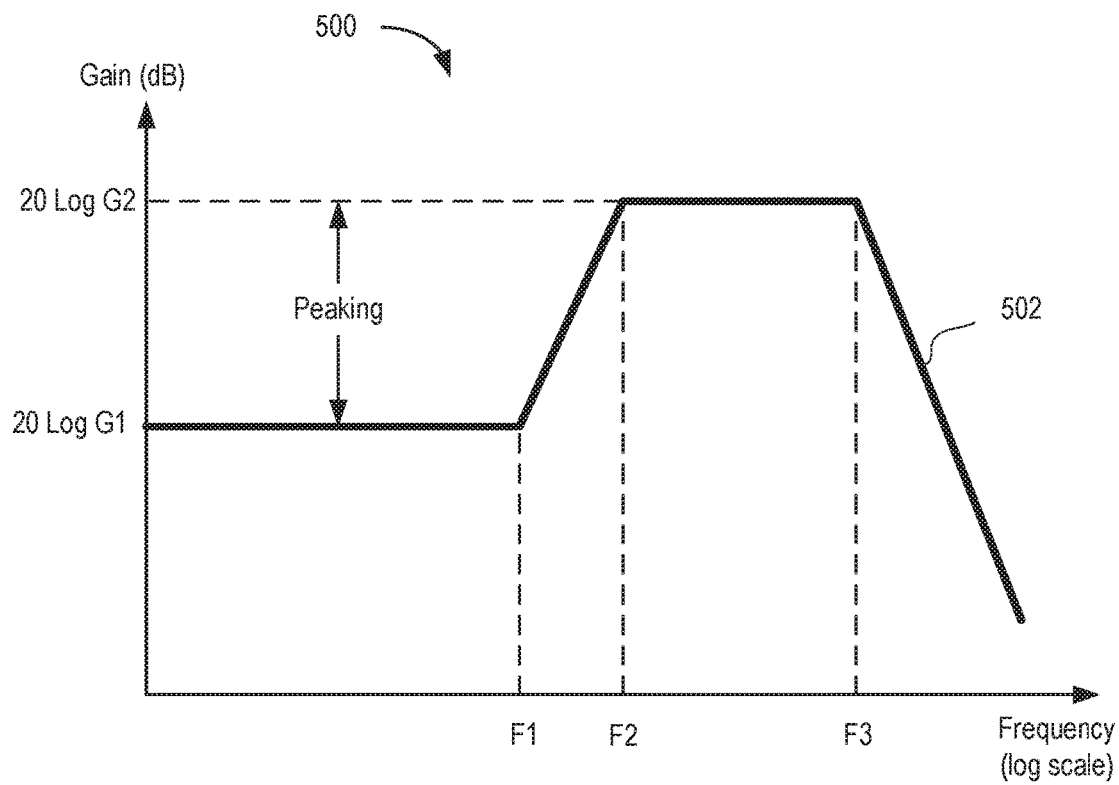
FIG. 5 is a graph of the transfer function of the CTLE of FIG. 4.

FIG. 5 is a graph 500 of the transfer function of the CTLE 106 of FIG. 4. The graph 500 includes a vertical axis representing Gain (dB) and a horizontal axis representing frequency (log scale). A curve 502 represents the transfer function of the CTLE 106, which has gain equal to 20*log(G2) between frequencies F2 and F3. Between frequencies 0 and F1, the gain is at 20*log(G1). Therefore, the obtained peaking is 20*log(G2/G1) in dB. The gain falls off after frequency F3.

Assume G1=0 dB and G2=6 dB, which results in 6 dB peaking. In such case:

$G1 = gm_1/gm_L = 1 (0\ dB) \rightarrow gm_1 = gm_L$ $G2 = (gm_1 + gm_2)/gm_L = 2 (6\ dB) \rightarrow gm_2 = gm_L$ Total $gm = gm_1 + gm_2 + gm_L = 3*gm_L$ To get a fair comparison with the CTLE 200 of FIG. 2, in terms of gain bandwidth product, $gm_L$ of the CTLE 106 should be doubled (e.g., $2*gm_L$). In such case, the inverter 402 has a transconductance of $2*gm_L$, the inverter 404 has a transconductance of $2*gm_L$, and the inverter 406 has a transconductance of $2*gm_L$. The total device drain parasitic capacitance at OUT is approximately 6*Cdd; the total device gate parasitic capacitance at OUT is approximately 2*Cgg, where Cdd and Cgg are the drain and gate parasitic capacitances, respectively, of an inverter with transconductance $gm_L$. Comparing to the additive topology of FIG. 2, the additive topology of FIG. 4 shows the same power consumption and device parasitic capacitance, but does not present a linearity problem because the outputs of the inverters 402 and 404 are tied together.

Table 1 below summarizes the comparison between the CTLE 200 of FIG. 2 and the CTLE 106 of FIG. 4.

TABLE 1

| LF gain = 0 dB HF gain = 6 dB | CTLE 200 | CTLE 300 | CTLE 106 |
|---|---|---|---|
| Total gm cell | $6*gm_L$ | $6*gm_L + 2(gm_B/gm_A)*gm_L$ | $6*gm_L$ |
| Cdd ($gm_L$) | 6 | 8 | 6 |
| Cgg ($gm_L$) | 2 | 2 | 2 |
| Linearity Problem | Yes | No | No |

As shown by Table 1, the topology of the CTLE 106 in FIG. 4 shows less power consumption than subtractive topology and no linearity issue as seen the additive topology of FIG. 2.

Figure 6:
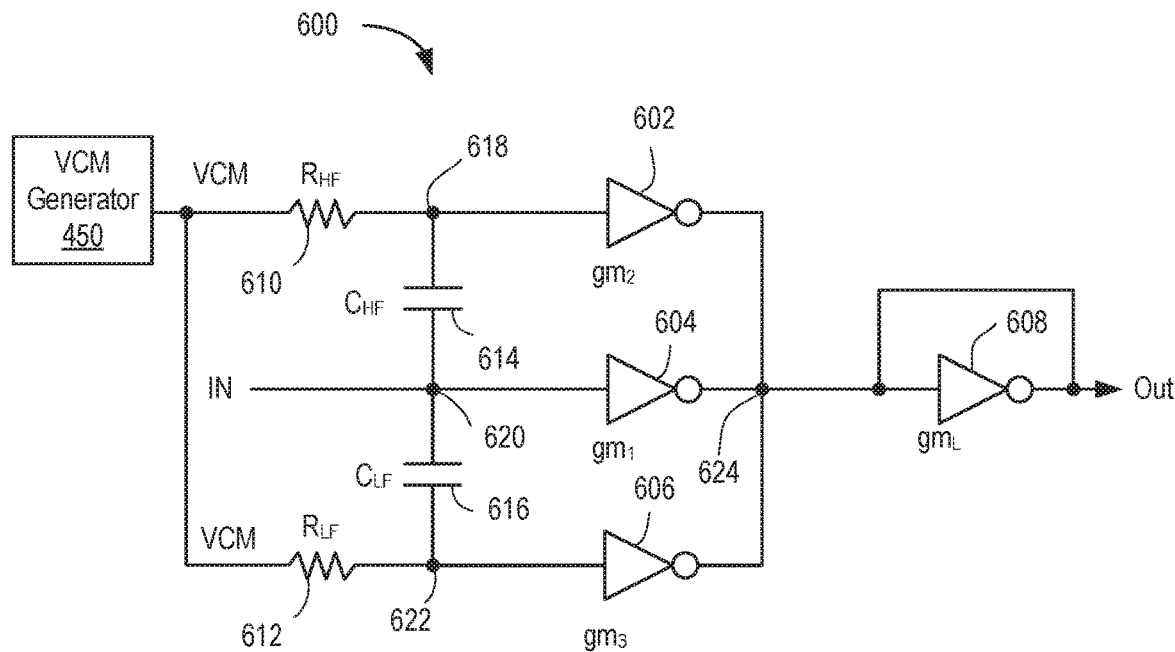
FIG. 6 is a schematic diagram depicting a CTLE according to another example.

FIG. 6 is a schematic diagram depicting a CTLE 600 according to another example. The CTLE 600 can be used as an alternative version of the CTLE 106 described above. The CTLE 600 presents multiple peaking at low and high frequency. The additional peaking is implemented by adding another inverter, resistor, and capacitor as compared to the CTLE 106 of FIG. 4.

In particular, the CTLE 600 includes inverters 602, 604, 606, and 608, as well as resistors 610 and 612, and capacitors 614 and 616. A node 618 is coupled to an input of the inverter 602. A node 620 is coupled to an input of the inverter 604. A node 622 is coupled to an input of the inverter 606. The capacitor 614 is coupled between nodes 618 and 620. The capacitor 616 is coupled between the nodes 620 and 622. The resistor 610 is coupled between the node 618 and a voltage VCM. The resistor 612 is coupled between the node 622 and the voltage VCM. A node 624 comprises an output of the inverter 602, an output of the inverter 604, an output of the inverter 606, an input of the inverter 608, and an output of the inverter 608. The node 624 provides the output signal (OUT). The node 620 receives the input signal (IN). The resistors 610 and 612 have resistances $R_{HF}$ and $R_{LF}$, respectively. The capacitors 614 and 616 have capacitances $C_{HF}$ and $C_{LF}$, respectively. The inverters 604, 602, 606, and 608 have transconductances $gm_1$, $gm_2$, $gm_3$, and $gm_L$, respectively.

Figure 7:
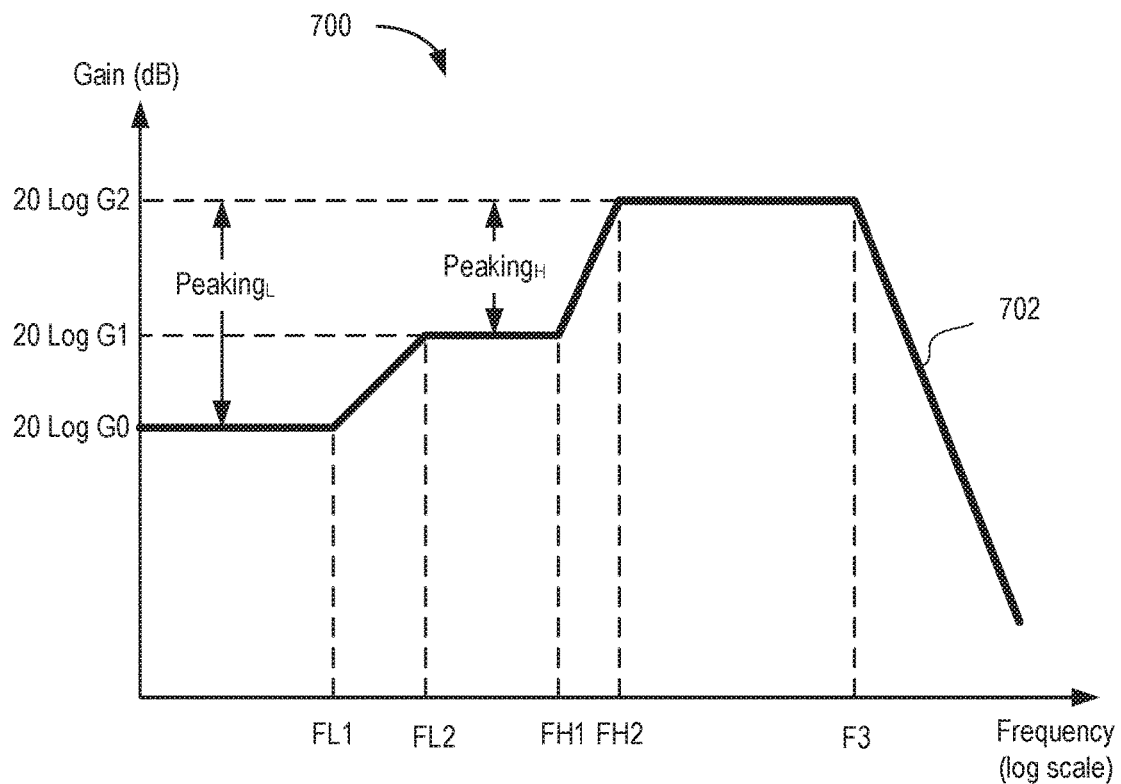
FIG. 7 is a graph of the transfer function of the CTLE of FIG. 6.

FIG. 7 is a graph 700 of the transfer function of the CTLE 600 of FIG. 6. The graph 700 includes a vertical axis representing Gain (dB) and a horizontal axis representing frequency (log scale). A curve 702 represents the transfer function of the CTLE 600, which has a medium gain equal to 20*log(G1) between frequencies FL2 and FH1, and a high gain equal to 20*log(G2) between frequencies FH2 and F3. Between frequencies 0 and FL1, a low gain is equal to 20*log(G0). Therefore, the obtained peakings are 20*log (G2/G1) and 20*log(G2/G0) in db for peaking$_H$ and peaking$_L$, respectively. The gain falls off after frequency F3. The CTLE 600 can be extended to have further peaks by adding inverter legs between the input and output (with corresponding capacitors and resistors).

Figure 8:
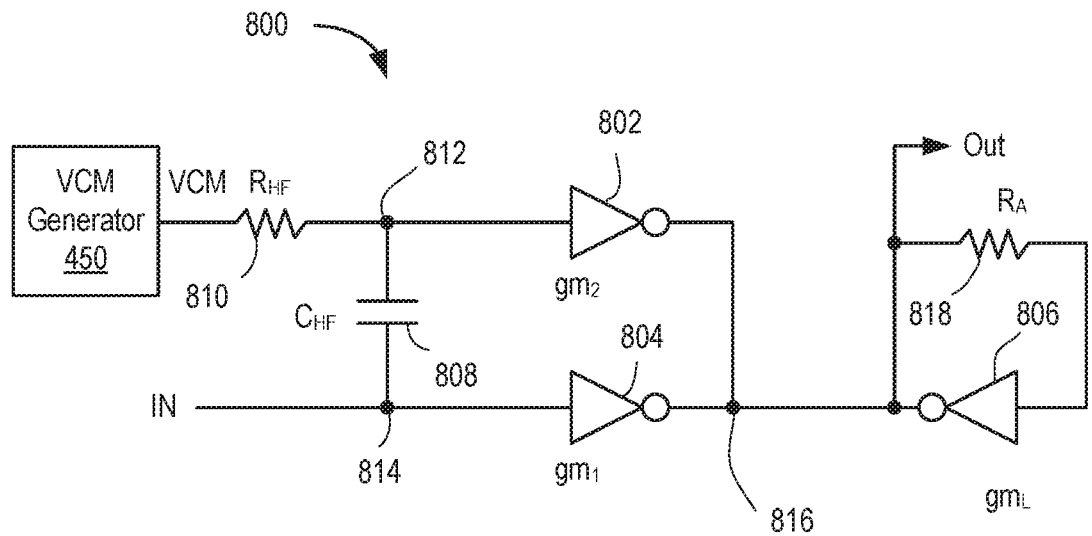
FIG. 8 is a schematic diagram depicting a CTLE according to another example.

FIG. 8 is a schematic diagram depicting a CTLE 800 according to another example. The CTLE 800 can be used as an alternative version of the CTLE 106 described above. The CTLE 800 includes inverters 802, 804, and 806, as well as a capacitor 808 and resistors 810 and 818. A node 812 is coupled to an input of the inverter 802. A node 814 is coupled to an input of the inverter 804. The capacitor 808 is coupled between the nodes 812 and 814. The resistor 810 is coupled between a voltage VCM and the node 812. The node 814 receives the input signal (IN). An output of the inverter 802 is coupled to: an output of the inverter 804 and an output of the inverter 806 (referred to as node 816). The node 816 provides the output signal (OUT). The resistor 818 is coupled between the node 816 and the input of the inverter 806. The resistor 810 has a resistance R$_{HF}$; the capacitor 808 has a capacitance C$_{HF}$; the inverter 804 has a transconductance gm$_1$; the inverter 802 has a transconductance gm$_2$; the inverter 806 has a transconductance gm$_L$, and the resistor 818 has a resistance RA. The CTLE 800 is similar to the CTLE 106 of FIG. 4, but employs bandwidth extension using an active inductor formed by the inverter 806 and the resistor 818.

Figure 9:
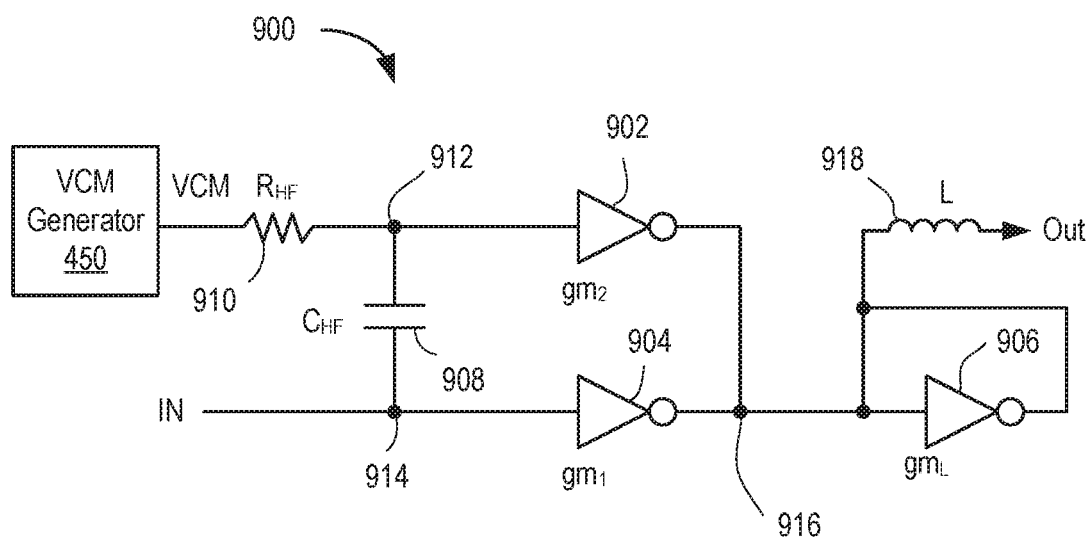
FIG. 9 is a schematic diagram depicting a CTLE according to another example.

FIG. 9 is a schematic diagram depicting a CTLE 900 according to another example. The CTLE 900 includes inverters 902, 904, and 906, as well as a capacitor 908, a resistor 910, and an inductor 918. A node 912 is coupled to an input of the inverter 902. A node 914 is coupled to an input of the inverter 904. The capacitor 908 is coupled between the nodes 912 and 914. The resistor 910 is coupled between a voltage VCM and the node 912. The node 914 receives the input signal (IN). An output of the inverter 902 is coupled to: an output of the inverter 904, an input of the inverter 906, and an output of the inverter 906 (referred to as node 916). The inductor 918 is coupled to the node 916 and provides the output signal (OUT). The resistor 910 has a resistance R$_{HF}$; the capacitor 908 has a capacitance C$_{HF}$; the inverter 904 has a transconductance gm$_1$; the inverter 902 has a transconductance gm$_2$; the inverter 906 has a transconductance gm$_L$; and the inductor 918 has an inductance L. The CTLE 900 is similar to the CTLE 106 of FIG. 4, but employs bandwidth extension using a passive inductor 918.

In further examples, the various components of the CTLEs 106, 600, 800, and 900 can be variable and capable of being programmed for equalization targets and applications. For the CTLE 106, this includes the resistor 410, the capacitor 408, the inverter 402, the inverter 404, and the inverter 406 (i.e., the inverters can have adjustable transconductance). For the CTLE 600, this includes the resistors 610, 612, the capacitors 614, 616, and the inverters 602, 604, 606, and 608. For the CTLE 800, this includes the resistors 810, 818, the capacitor 808, and the inverters 802, 804, and 806. For the CTLE 900, this includes the resistor 910, the capacitor 908, the inductor 918, and the inverters 902, 904, and 906.

Figure 10:
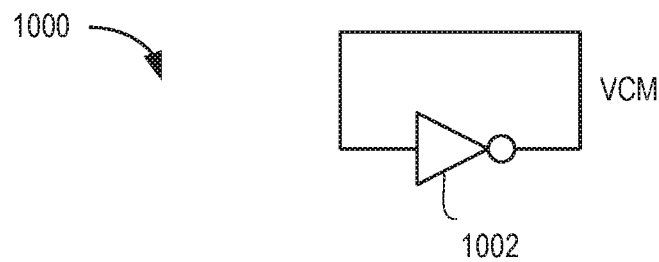
FIG. 10 is a schematic diagram depicting a VCM generator for the CTLE circuits described herein according to an example.

FIG. 10 is a schematic diagram depicting a VCM generator 1000 for the CTLE circuits described herein according to an example. The VCM generator 1000 includes an inverter 1002 having its input tied to its output to provide the voltage VCM. The VCM generator 1000 is implemented using an inverter-based diode. The inverter 1002 should be a replica of the inverters 402, 404, and 406 in terms of layout style and biasing condition (e.g., current density).

Figure 11:
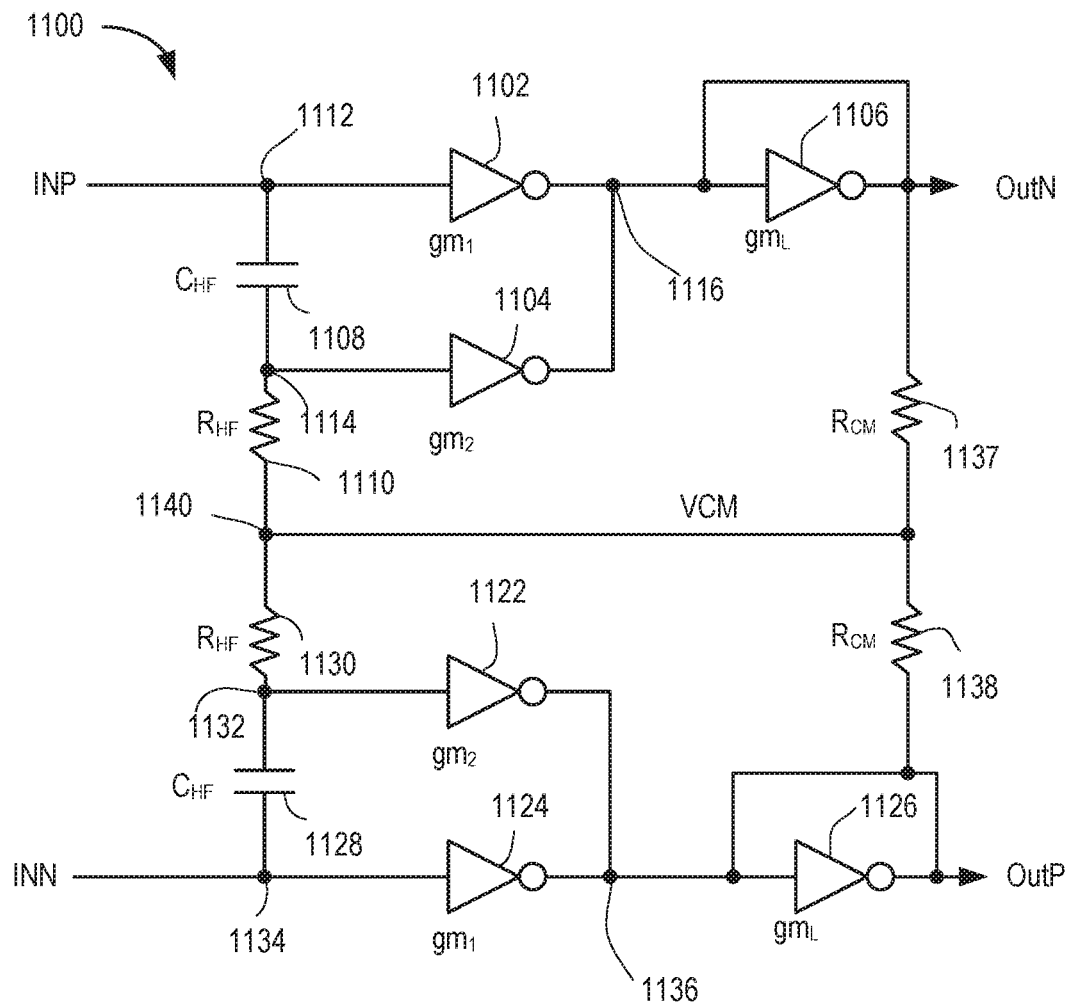
FIG. 11 is a schematic diagram depicting a CTLE according to another example.

FIG. 11 is a schematic diagram depicting a CTLE 1100 according to another example. The CTLE 1100 generates the common mode voltage VCM from pseudo-differential outputs. The CTLE 1100 includes inverters 1102, 1104, 1106, 1122, 1124, and 1126. The CTLE 1100 further includes resistors 1110, 1130, 1137, and 1138. The CTLE 1100 further includes capacitors 1108 and 1128.

A node 1112 is coupled to an input of the inverter 1102. A node 1114 is coupled to an input of the inverter 1104. The capacitor 1108 is coupled between the nodes 1112 and 1114. The resistor 1110 is coupled between the node 1114 and a node 1140 that provides VCM. The node 1112 receives the input signal (INP). An output of the inverter 1102 is coupled to: an output of the inverter 1104, an input of the inverter 1106, and an output of the inverter 1106 (referred to as node 1116). The node 1116 provides the output signal (OUTN). The resistor 1110 has a resistance R$_{HF}$; the capacitor 1108 has a capacitance C$_{HF}$; the inverter 1102 has a transconductance gm$_1$; the inverter 1104 has a transconductance gm$_2$; and the inverter 1106 has a transconductance gm$_L$.

A node 1132 is coupled to an input of the inverter 1122. A node 1134 is coupled to an input of the inverter 1124. The capacitor 1128 is coupled between the nodes 1132 and 1134. The resistor 1130 is coupled between the node 1132 and the node 1140 that provides VCM. The node 1134 receives the input signal (INN). An output of the inverter 1122 is coupled to: an output of the inverter 1124, an input of the inverter 1126, and an output of the inverter 1126 (referred to as node 1136). The node 1136 provides the output signal (OUTP). The resistor 1130 has a resistance R$_{HF}$; the capacitor 1128 has a capacitance C$_{HF}$; the inverter 1124 has a transconductance gm$_1$; the inverter 1122 has a transconductance gm$_2$; and the inverter 1126 has a transconductance gm$_L$.

The resistor 1137 is coupled between the node 1116 and the node 1140. The resistor 1138 is coupled between the node 1136 and the node 1140. The node 1140 provides the voltage VCM. In this pseudo-differential case, VCM is generated through self-bias, which eliminates the power consumption associated with having a replica diode as the VCM generator.

Figure 12A:
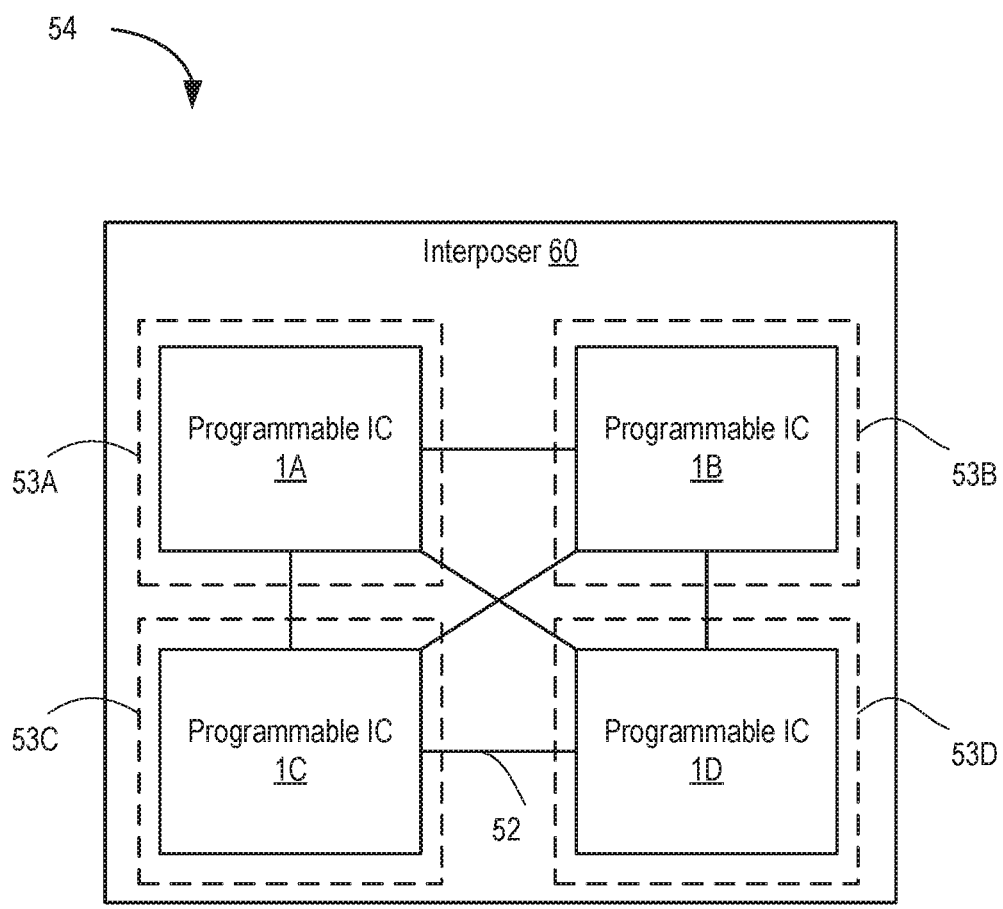
FIG. 12A is a block diagram depicting a programmable device according to an example.

FIG. 12A is a block diagram depicting a programmable device 54 according to an example. The programmable device 54 includes a plurality of programmable integrated circuits (ICs) 1, e.g., programmable ICs 1A, 1B, 1C, and 1D. In an example, each programmable IC 1 is an IC die disposed on an interposer 60. Each programmable IC 1 comprises a super logic region (SLR) 53 of the programmable device 54, e.g., SLRs 53A, 53B, 53C, and 53D. The programmable ICs 1 are interconnected through conductors on the interposer 60 (referred to as super long lines (SLLs) 52).

Figure 12B:
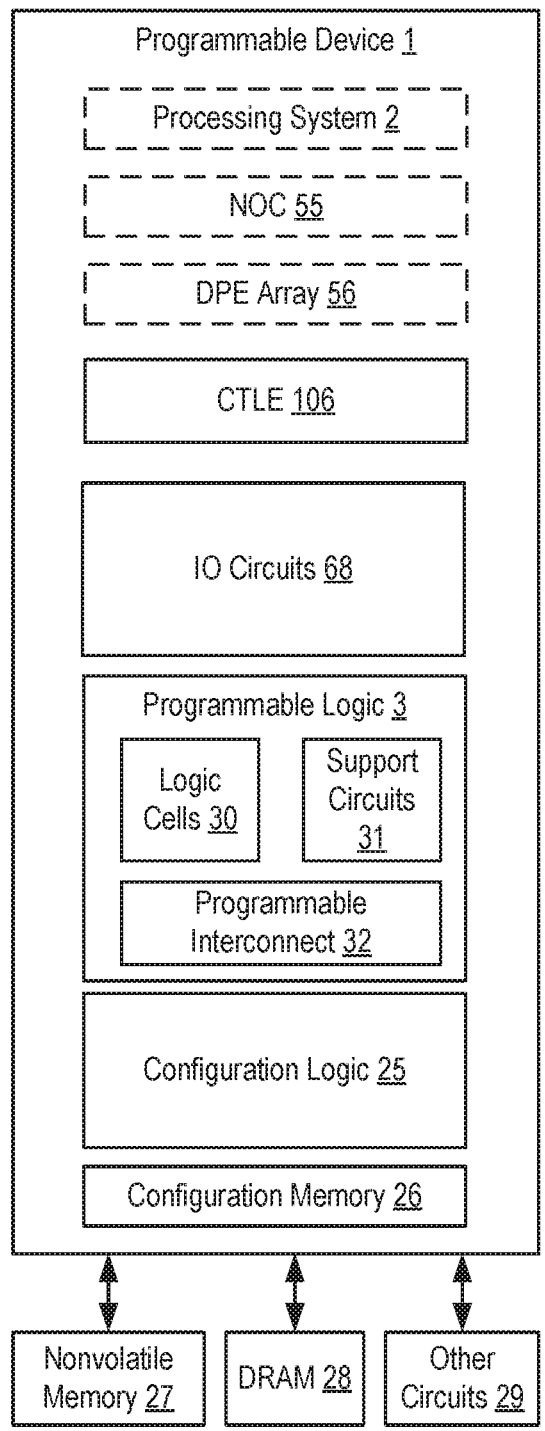
FIG. 12B is a block diagram depicting a programmable IC according to an example.

FIG. 12B is a block diagram depicting a programmable IC 1 according to an example. The programmable IC 1 can be used to implement a programmable device or one of the programmable ICs in the programmable device 54. The programmable IC 1 includes programmable logic (PL) 3 (also referred to as a programmable fabric), configuration logic 25, and configuration memory 26. The programmable IC 1 can be coupled to external circuits, such as nonvolatile memory 27, DRAM 28, and other circuits 29. The PL 3 includes logic cells 30, support circuits 31, and programmable interconnect 32. The logic cells 30 include circuits that can be configured to implement general logic functions of a plurality of inputs. The support circuits 31 include dedicated circuits, such as transceivers, input/output blocks, digital signal processors, memories, and the like. The logic cells and the support circuits 31 can be interconnected using the programmable interconnect 32. Information for programming the logic cells 30, for setting parameters of the support circuits 31, and for programming the programmable interconnect 32 is stored in the configuration memory 26 by the configuration logic 25. The configuration logic 25 can obtain the configuration data from the nonvolatile memory 27 or any other source (e.g., the DRAM 28 or from the other circuits 29). In some examples, the programmable IC 1 includes a processing system (PS) 2. The PS 2 can include microprocessor(s), memory, support circuits, IO circuits, and the like. In some examples, the programmable IC 1 includes a network-on-chip (NOC) 55 and data processing engine (DPE) array 56. The NOC 55 is configured to provide for communication between subsystems of the programmable IC 1, such as between the PS 2, the PL 3, and the DPE array 56. The DPE array 56 can include an array of DPE's configured to perform data processing, such as an array of vector processors. In an example, the programmable IC 1 can include one or more instances of the CTLE 106, including any example implementation thereof described herein.

Figure 12C:
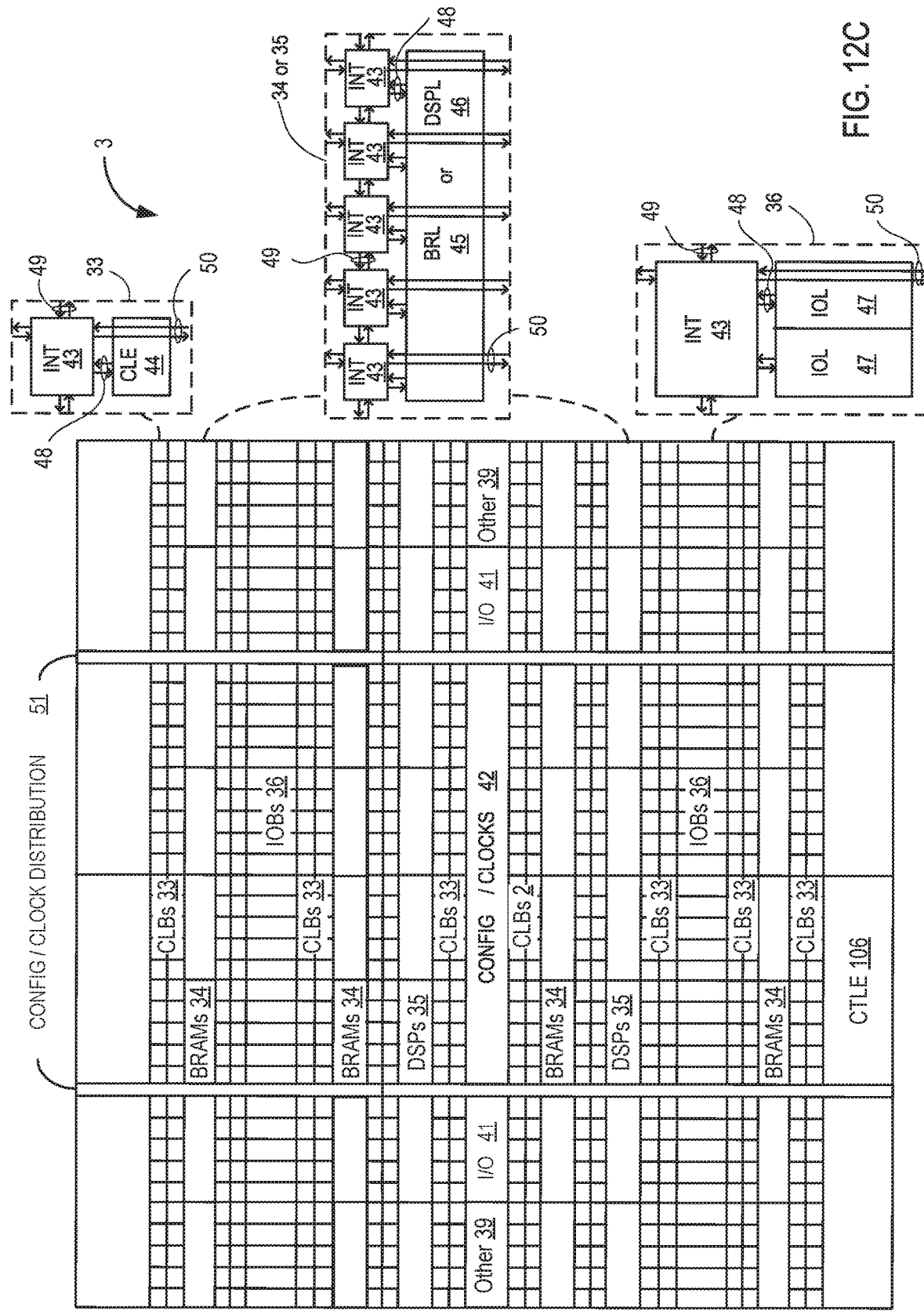
FIG. 12C illustrates a field programmable gate array (FPGA) implementation of the programmable IC according to an example.

FIG. 12C illustrates a field programmable gate array (FPGA) implementation of the programmable IC 1 that includes the PL 3. The PL 3 shown in FIG. 12C can be used in any example of the programmable devices described herein. The PL 3 includes a large number of different programmable tiles including, configurable logic blocks ("CLBs") 33, random access memory blocks ("BRAMs") 34, input/output blocks ("IOBs") 36, configuration and clocking logic ("CONFIG/CLOCKS") 42, digital signal processing blocks ("DSPs") 35, specialized input/output blocks ("I/O") 41 (e.g., configuration ports and clock ports), and other programmable logic 39 such as digital clock managers, analog-to-digital converters, system monitoring logic, and so forth. In an example, the programmable IC 1 can include one or more instances of the CTLE 106, including any example implementation thereof described herein.

In some PLs, each programmable tile can include at least one programmable interconnect element ("INT") 43 having connections to input and output terminals 48 of a programmable logic element within the same tile, as shown by examples included at the top of FIG. 6D. Each programmable interconnect element 43 can also include connections to interconnect segments 49 of adjacent programmable interconnect element(s) in the same tile or other tile(s). Each programmable interconnect element 43 can also include connections to interconnect segments 50 of general routing resources between logic blocks (not shown). The general routing resources can include routing channels between logic blocks (not shown) comprising tracks of interconnect segments (e.g., interconnect segments 50) and switch blocks (not shown) for connecting interconnect segments. The interconnect segments of the general routing resources (e.g., interconnect segments 50) can span one or more logic blocks. The programmable interconnect elements 43 taken together with the general routing resources implement a programmable interconnect structure ("programmable interconnect") for the illustrated PL.

In an example implementation, a CLB 33 can include a configurable logic element ("CLE") 44 that can be programmed to implement user logic plus a single programmable interconnect element ("INT") 43. A BRAM 34 can include a BRAM logic element ("BRL") 45 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 35 can include a DSP logic element ("DSPL") 46 in addition to an appropriate number of programmable interconnect elements. An IOB 36 can include, for example, two instances of an input/output logic element ("IOL") 47 in addition to one instance of the programmable interconnect element 43. As will be clear to those of skill in the art, the actual I/O pads connected, for example, to the I/O logic element 47 typically are not confined to the area of the input/output logic element 47.

In the pictured example, a horizontal area near the center of the die (shown in FIG. 3D) is used for configuration, clock, and other control logic. Vertical columns 51 extending from this horizontal area or column are used to distribute the clocks and configuration signals across the breadth of the PL.

Some PLs utilizing the architecture illustrated in FIG. 12C include additional logic blocks that disrupt the regular columnar structure making up a large part of the PL. The additional logic blocks can be programmable blocks and/or dedicated logic. Note that FIG. 12C is intended to illustrate only an exemplary PL architecture. For example, the numbers of logic blocks in a row, the relative width of the rows, the number and order of rows, the types of logic blocks included in the rows, the relative sizes of the logic blocks, and the interconnect/logic implementations included at the top of FIG. 12C are purely exemplary. For example, in an actual PL more than one adjacent row of CLBs is typically included wherever the CLBs appear, to facilitate the efficient implementation of user logic, but the number of adjacent CLB rows varies with the overall size of the PL.

While the foregoing is directed to specific examples, other and further examples may be devised without departing from the basic scope thereof, and the scope thereof is determined by the claims that follow.

What is claimed is:

1. A continuous time linear equalizer (CTLE), comprising:
   a first inverter having an input connected to a first node;
   a second inverter having an input connected to a second node, the input of the second inverter configured to receive a low-frequency component of an input signal and a high-frequency component of the input signal via the second node;
   a capacitor connected to the first node and the second node, wherein the capacitor is configured to block the low-frequency component and pass the high-frequency component to the first node;
   a resistor coupled between a common-mode voltage and the first node;
   a third inverter having an output to provide an output signal; and
   a third node comprising an output of the first inverter, an output of the second inverter, an input of the third inverter, and the output of the third inverter.

2. The CTLE of claim 1, further comprising:
   a common-mode voltage generator, coupled to the resistor, to provide the common-mode voltage.

3. The CTLE of claim 2, wherein the common-mode voltage generator comprises:
   a fourth inverter having an input and an output, the input and the output of the fourth inverter being coupled and providing the common-mode voltage.

4. The CTLE of claim 3, wherein the fourth inverter is a replica of each of the first, second, and third inverters.

5. The CTLE of claim 1, further comprising:
a fourth inverter having an output coupled to the third node;
an additional capacitor coupled between the input of the second inverter and an input of the fourth inverter; and
an additional resistor coupled between the common-mode voltage and the input of the fourth inverter.

6. The CTLE of claim 5, further comprising:
a common-mode voltage generator, coupled to the resistor and the additional resistor, to provide the common-mode voltage.

7. The CTLE of claim 6, wherein the common-mode voltage generator comprises:
a fourth inverter having an input and an output, the input and the output of the fourth inverter being coupled and providing the common-mode voltage.

8. The CTLE of claim 1, further comprising:
an inductor coupled between the third node and the output signal.

9. A continuous time linear equalizer (CTLE), comprising:
a first inverter having an input connected to a first node;
a second inverter having an input connected to a second node, the input of the second inverter configured to receive an input signal via the second node;
a capacitor connected to the first node and the second node;
a resistor coupled between a common-mode voltage and the first node;
a third inverter having an output to provide an output signal; and
a third node comprising an output of the first inverter, an output of the second inverter, an input of the third inverter, and the output of the third inverter, wherein the capacitor comprises a first capacitor, and the resistor comprises a first resistor, and wherein the CTLE further comprises:
a fourth inverter;
a fifth inverter having an input coupled to receive an additional input signal, the input signal and the additional input signal comprising a differential signal pair;
a second capacitor coupled between the input of the fifth inverter and an input of the fourth inverter;
a second resistor coupled between the input of the fourth inverter and the common-mode voltage;
a sixth inverter having an output that provides an additional output signal, the output signal and the additional output signal comprising a differential signal pair;
a fourth node comprising an output of the fourth inverter, an output of the fifth inverter, an input of the sixth inverter, and the output of the sixth inverter;
a fifth node providing the common-mode voltage;
a third resistor coupled between the third node and the fifth node; and
a fourth resistor coupled between the fourth node and the fifth node.

10. A receiver, comprising:
a front-end circuit having a continuous time linear equalizer (CTLE);
a digital backend circuit coupled to the front-end circuit;
the CTLE comprising:
a first inverter having an input connected to a first node;
a second inverter having an input connected to a second node, the input of the second inverter configured to receive a low-frequency component of an input signal and a high-frequency component of the input signal via the second node;
a capacitor connected to the first node and the second node, wherein the capacitor is configured to block the low-frequency component and pass the high-frequency component to the first node;
a resistor coupled between a common-mode voltage and the first node;
a third inverter having an output to provide an output signal; and
a third node comprising an output of the first inverter, an output of the second inverter, an input of the third inverter, and the output of the third inverter.

11. The receiver of claim 10, further comprising:
a common-mode voltage generator, coupled to the resistor, to provide the common-mode voltage.

12. The receiver of claim 11, wherein the common-mode voltage generator comprises:
a fourth inverter having an input and an output, the input and the output of the fourth inverter being coupled and providing the common-mode voltage.

13. The receiver of claim 12, wherein the fourth inverter is a replica of each of the first, second, and third inverters.

14. The receiver of claim 10, further comprising:
a fourth inverter having an output coupled to the third node;
an additional capacitor coupled between the input of the second inverter and an input of the fourth inverter; and
an additional resistor coupled between the common-mode voltage and the input of the fourth inverter.

15. The receiver of claim 10, further comprising:
an inductor coupled between the third node and the output signal.

16. The receiver of claim 10, wherein the capacitor comprises a first capacitor, and the resistor comprises a first resistor, and wherein the CTLE further comprises:
a fourth inverter;
a fifth inverter having an input coupled to receive an additional input signal, the input signal and the additional input signal comprising a differential signal pair;
a second capacitor coupled between the input of the fifth inverter and an input of the fourth inverter;
a second resistor coupled between the input of the fourth inverter and the common-mode voltage;
a sixth inverter having an output that provides an additional output signal, the output signal and the additional output signal comprising a differential signal pair;
a fourth node comprising an output of the fourth inverter, an output of the fifth inverter, an input of the sixth inverter, and the output of the sixth inverter;
a fifth node providing the common-mode voltage;
a third resistor coupled between the third node and the fifth node; and
a fourth resistor coupled between the fourth node and the fifth node.

17. A continuous time linear equalizer (CTLE), comprising:
a first inverter having an input connected to a first node;
a second inverter having an input connected to a second node, the input of the second inverter is configured to receive a low-frequency component of an input signal and a high-frequency component of the input signal via the second node;
a capacitor connected to the first node and the second node, wherein the capacitor is configured to block the low-frequency component and pass the high-frequency component to the first node;

a first resistor coupled between a common-mode voltage and the input of the first inverter;
a third inverter;
a third node comprising an output of the first inverter, an output of the second inverter, an output of the third inverter, the third node providing an output signal; and
a second resistor coupled between an input of the third inverter and the third node.

18. The CTLE of claim 17, further comprising:
a common-mode voltage generator, coupled to the first resistor, to provide the common-mode voltage.

19. The CTLE of claim 18, wherein the common-mode voltage generator comprises:
a fourth inverter having an input and an output, the input and the output of the fourth inverter being coupled and providing the common-mode voltage.

20. The CTLE of claim 19, wherein the fourth inverter is a replica of each of the first, second, and third inverters.

\* \* \* \* \*